US009213223B2

(12) United States Patent
Mashitani (10) Patent No.: US 9,213,223 B2
(45) Date of Patent: Dec. 15, 2015

(54) IMAGE PROJECTING DEVICE WITH MOVABLE LENS

(71) Applicant: Panasonic Corporation, Osaka (JP)

(72) Inventor: Ken Mashitani, Osaka (JP)

(73) Assignee: PANASONIC INTELLECTUAL PROPERTY MANAGEMENT CO., LTD., Osaka (JP)

( * ) Notice: Subject to any disclaimer, the term of this patent is extended or adjusted under 35 U.S.C. 154(b) by 260 days.

(21) Appl. No.: 13/948,740

(22) Filed: Jul. 23, 2013

(65) Prior Publication Data

US 2014/0036239 A1    Feb. 6, 2014

(30) Foreign Application Priority Data

Jul. 31, 2012  (JP) .................................. 2012-169136
Jul. 5, 2013   (JP) .................................. 2013-141496

(51) Int. Cl.
  *G03B 21/14*   (2006.01)
  *G03B 5/02*    (2006.01)
  *G03B 5/04*    (2006.01)
  *G02B 7/02*    (2006.01)
  *G02B 26/08*   (2006.01)
  (Continued)

(52) U.S. Cl.
  CPC .............. *G03B 21/14* (2013.01); *G02B 7/023* (2013.01); *G02B 26/08* (2013.01); *G02B 26/0841* (2013.01); *G02B 26/0875* (2013.01); *G02B 26/0883* (2013.01); *G02B 26/101* (2013.01); *G03B 5/00* (2013.01); *G03B 5/02* (2013.01); *G03B 5/04* (2013.01); *G03B 21/142* (2013.01); *H04N 9/312* (2013.01);
  (Continued)

(58) Field of Classification Search
  CPC ........ G03B 21/14; G03B 5/00; G03B 21/142; G03B 2205/0092; G03B 2205/0069; G03B 5/02; G03B 5/04; G03B 5/06; G03B 2205/0084; G03B 2205/0061; G03B 21/43; G03B 2205/0053; G03B 2205/0023; G02B 7/023; G02B 26/08; G02B 26/0875; G02B 26/101; G02B 26/0841; G02B 26/06; G02B 26/0883; G03F 7/70258; H04N 9/312
  See application file for complete search history.

(56) References Cited

U.S. PATENT DOCUMENTS

2003/0007138 A1*  1/2003  Shigematsu et al. ............ 355/67
2004/0184163 A1*  9/2004  Nishioka et al. ............. 359/726
(Continued)

FOREIGN PATENT DOCUMENTS

| JE | 2008-139389 | 6/2008 |
| JP | 06-043417   | 2/1994 |
| JP | 2005-084581 | 3/2005 |
| JP | 2006-309076 | 11/2006 |

*Primary Examiner* — William C Dowling
*Assistant Examiner* — Magda Cruz
(74) *Attorney, Agent, or Firm* — Hamre, Schumann, Mueller & Larson, P.C.

(57) ABSTRACT

An image projecting device of the present invention includes an image display section for displaying an image, a projecting optical system for outputting the image along an optical path and projecting the image onto a projection surface, and a lens unit provided on any position on the optical path. The lens unit includes a lens section having a lens movable along at least two or more directions in a plane vertical to an optical axis of the projecting optical system, and a driving section having an actuator section for moving the lens section, and the actuator section is disposed so that a thrust line passes through a centroid of the lens section. The driving section moves the lens so as to tilt an optical axis of light emitted from the image display section, and move a display position of pixels on the projection surface composing the image displayed by the image display section.

7 Claims, 11 Drawing Sheets

(51) Int. Cl.
*G02B 26/10* (2006.01)
*H04N 9/31* (2006.01)
*G03B 5/00* (2006.01)
*G03F 7/20* (2006.01)

(52) U.S. Cl.
CPC ............... *G03B 2205/0069* (2013.01); *G03B 2205/0092* (2013.01); *G03F 7/70258* (2013.01)

(56) References Cited

U.S. PATENT DOCUMENTS

2005/0057732 A1   3/2005  Hayashi
2007/0091274 A1*  4/2007  Conner ............... H04N 9/3188
                                              353/31

* cited by examiner

IMAGE PROJECTING DEVICE WITH MOVABLE LENS

BACKGROUND OF THE INVENTION

1. Field of the Invention

The present invention relates to an image projecting device for projecting an image.

2. Description of the Related Art

Unexamined Japanese Patent Publication No. 2005-84581 discloses an image projecting device. This image projecting device includes two decentered lenses that can decenter to an approximately vertical direction between a projecting optical system and a color synthesizing prism. This image projecting device drives the two decentered lenses back and forth to the vertical direction with respect to an optical axis.

As a result, the image projecting device can provide an image having resolution higher than a resolution of image displayed by a light valve without deteriorating quality.

SUMMARY OF THE INVENTION

The image projecting device of the present invention includes an image display section for displaying an image, a projecting optical system for outputting the image displayed by the image display section along an optical path and projecting it onto a projection surface, and a lens unit provided on any position on the optical path. The lens unit includes a lens section having a lens movable along at least two or more directions in a plane vertical to an optical axis of the projecting optical system, and a driving section having an actuator section for moving the lens section. The actuator section is disposed so that a thrust line passes through a centroid of the lens section. The driving section moves the lens so as to tilt an optical axis of light emitted from the image display section and moves a display position on a projection surface of pixels composing the image displayed by the image display section.

According to the present invention, the image projecting device that can project an image with high resolution in a simple constitution can be provided. Further, a gap between the projecting optical system and the image display section can be shortened.

DETAILED DESCRIPTION OF THE PREFERRED EMBODIMENTS

Embodiments are described in detail below suitably with reference to the drawings. In some cases, a description that is more detailed than necessary is omitted. For example, a detailed description about already well-known portions and an overlapped description about the substantially same constitution are occasionally omitted. This is for preventing the following description from being unnecessarily redundant and making people skilled in the art easily understand the present invention.

The inventors provide the accompanying drawings and the following description in order that people skilled in the art sufficiently understand the present invention, and thus do not intend to limit the subject matter described in the claims.

1. First Exemplary Embodiment

1-1. Description of Constitution

1-1-1. Entire Constitution

Figure 1:
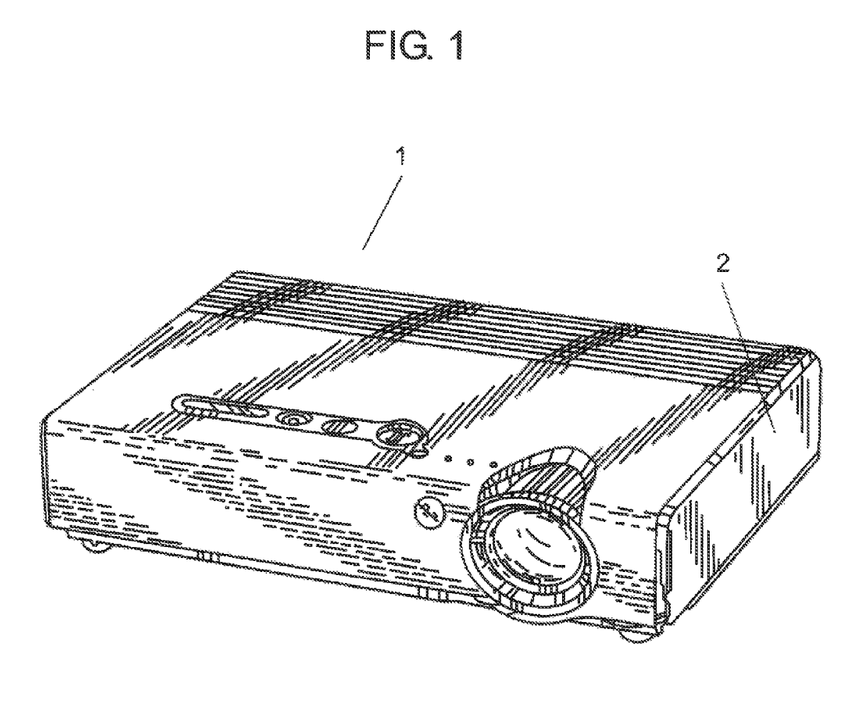
FIG. 1 is an appearance perspective view illustrating a projector according to an embodiment.
Figure 2:
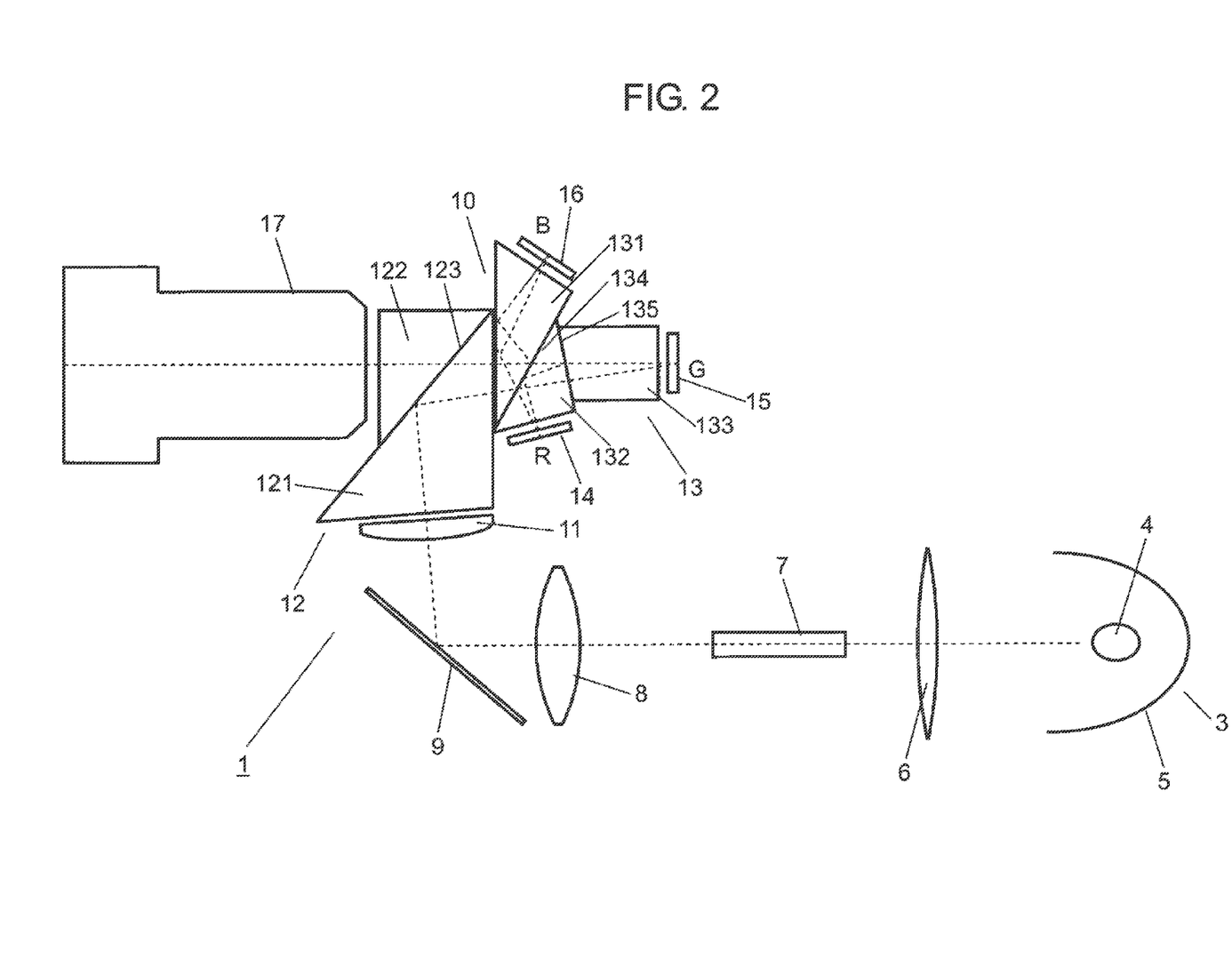
FIG. 2 is a pattern diagram illustrating a constitution of the projector according to the embodiment.

FIG. 1 is a perspective view illustrating an appearance of a projector as one example of an image projecting device according to an embodiment. FIG. 2 is a pattern diagram illustrating a constitution of a main section of the projector.

As shown in FIG. 1, projector 1 includes, in enclosure 2, a light source, a image display section that has a digital micro-mirror device (hereinafter, DMD) and displays an image, and a projecting optical system for projecting the image displayed by the image display section onto a projection surface. Projector 1 reflects light emitted from the light source on DMD so as to generate an image to be displayed, and projects the generated image onto a projection surface such as a screen via the projecting optical system.

As shown in FIG. 2, light source 3 of projector 1 has luminous tube 4 and reflector 5. Luminous tube 4 is composed of, for example, a high-pressure mercury lamp or a metal halide lamp, and emits a plurality of light fluxes that includes red, green and blue light beams and has different wavelength bands. Reflector 5 reflects the light fluxes emitted from luminous tube 4 and aligns emitting directions.

The light emitted from luminous tube 4 is incident on a total reflecting prism of image display section 10 via various optical systems composed of reflector 5, condenser lens 6, rod 7, relay lens 8, and reflective mirror 9.

Condenser lens 6 is a lens for condensing the light fluxes emitted from light source 3 to rod 7. Rod 7 is an optical part that totally reflects light inside, and a light flux incident via condenser lens 6 is reflected in rod 7 at plural number of times. As a result, light intensity distributions of the light fluxes passing through rod 7 are substantially uniform. Relay lens 8 is a lens for matching sizes of cross sections of the light fluxes passing through rod 7 with a size of the DMD of image display section 10. Reflective mirror 9 reflects the light fluxes passing through relay lens 8 on the total reflecting prism of image display section 10.

Image display section 10 has field lens 11 on which a light flux reflected on reflective mirror 9 of light source 3 is incident, total reflecting prism 12 that is an image synthesizing section on which the light flux passing through field lens 11 is incident, color prism 13 on which the light flux totally reflected on total reflecting prism 12 is incident, DMD 14 for red light, DMD 15 for green light and a DMD 16 for blue light on which red light, green light and blue light dispersed by color prism 13 are incident. DMD 14 for red light, DMD 15 for green light, and DMD 16 for blue light function as image display devices for displaying images. Field lens 11 is a lens for making advancing directions of incident light beams approximately parallel.

Total reflecting prism 12 is composed of prism 121 and prism 122, and thin air space 123 is present in a vicinal plane between prism 121 and prism 122. Air space 123 provided in the vicinal plane between prism 121 and prism 122 totally reflects light fluxes incident at a critical angle or more.

Color prism 13 is composed of prism 131, prism 132, and prism 133. Dichroic mirror 134 for reflecting blue light is provided in a vicinal plane between prism 131 and prism 132. Further, dichroic mirror 135 for reflecting red light is provided in a vicinal plane between prism 132 and prism 133. Prism 131 and prism 132 of color prism 13 disperse a light flux incident via total reflecting prism 12 into red light, green light and blue light, and the dispersed red light, green light and blue light are incident on DMD 14, DMD 15, and DMD 16, respectively.

DMD 14, DMD 15 and DMD 16 have 1920×1080 micromirrors, and deflect the respective micromirrors according to image signals. As a result, DMD 14, DMD 15, and DMD 16 reflect light that is allowed to incident on projecting optical system 17, and light that is reflected out of an effective range of projecting optical system 17 separately. A light flux incident on projecting optical system 17 in the light fluxes reflected on DMD 14, DMD 15, and DMD 16 is synthesized by color prism 13. The light flux synthesized by color prism 13 is incident on total reflecting prism 12. Since the light flux incident on total reflecting prism 12 is incident on air space 123 at a critical angle or less, this light flux transmits through air space 123 so as to be incident on projecting optical system 17.

Projecting optical system 17 is an optical system for enlarging the incident light flux, and includes a lens group having a focus adjusting function and a zoom function. An image generated in image display section 10 is projected onto a projection surface such as a screen via projecting optical system 17.

1-1-2. Constitution of Main Section

Figure 3:
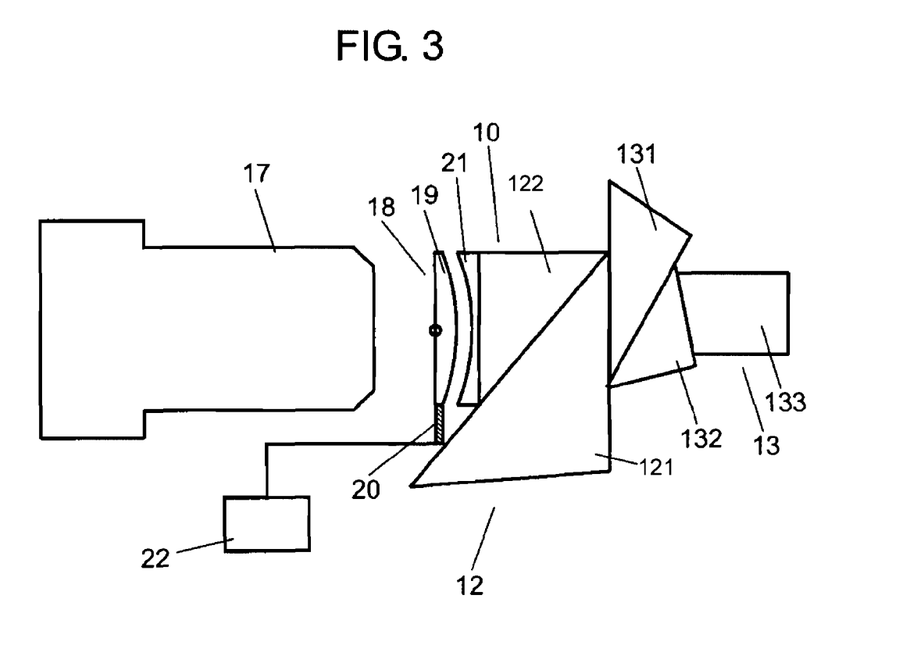
FIG. 3 is a pattern diagram for describing an outline of an optical system provided between a projecting optical system and a prism in the projector according to the embodiment.

FIG. 3 is a pattern diagram for describing an outline of the optical system provided between projecting optical system 17 and total reflecting prism 12 of image display section 10.

As shown in FIG. 3, in projector 1, lens unit 18 is disposed between total reflecting prism 12 of image display section 10 and projecting optical system 17. Lens unit 18 has lens 19 that is movable to at least two directions in a plane vertical to an optical axis of projecting optical system 17, and driving section 20 for moving lens 19. Further, fixed lens 21 whose type is different from that of lens 19 is disposed between lens unit 18 and image display section 10.

Lens 21 is a plano-concave lens such that total reflecting prism 12 of image display section 10 is a flat surface and lens unit 18 has a concave lens. The flat surface of lens 21 touches prism 122 of total reflecting prism 12. Lens 19 of lens unit 18 is a plano-convex lens such that lens 21 is a convex lens and projecting optical system 17 has a flat surface. Lens 19 of lens unit 18 is disposed between projecting optical system 17 and lens 21 so as to be spaced from projecting optical system 17 and lens 21 by a predetermined gap.

Driving section 20 of lens unit 18 is connected to control circuit 22, and supplies a driving signal from control circuit 22 so as to move lens 19 to at least two or more directions in a plane vertical to an optical axis of projecting optical system 17.

Figure 4:
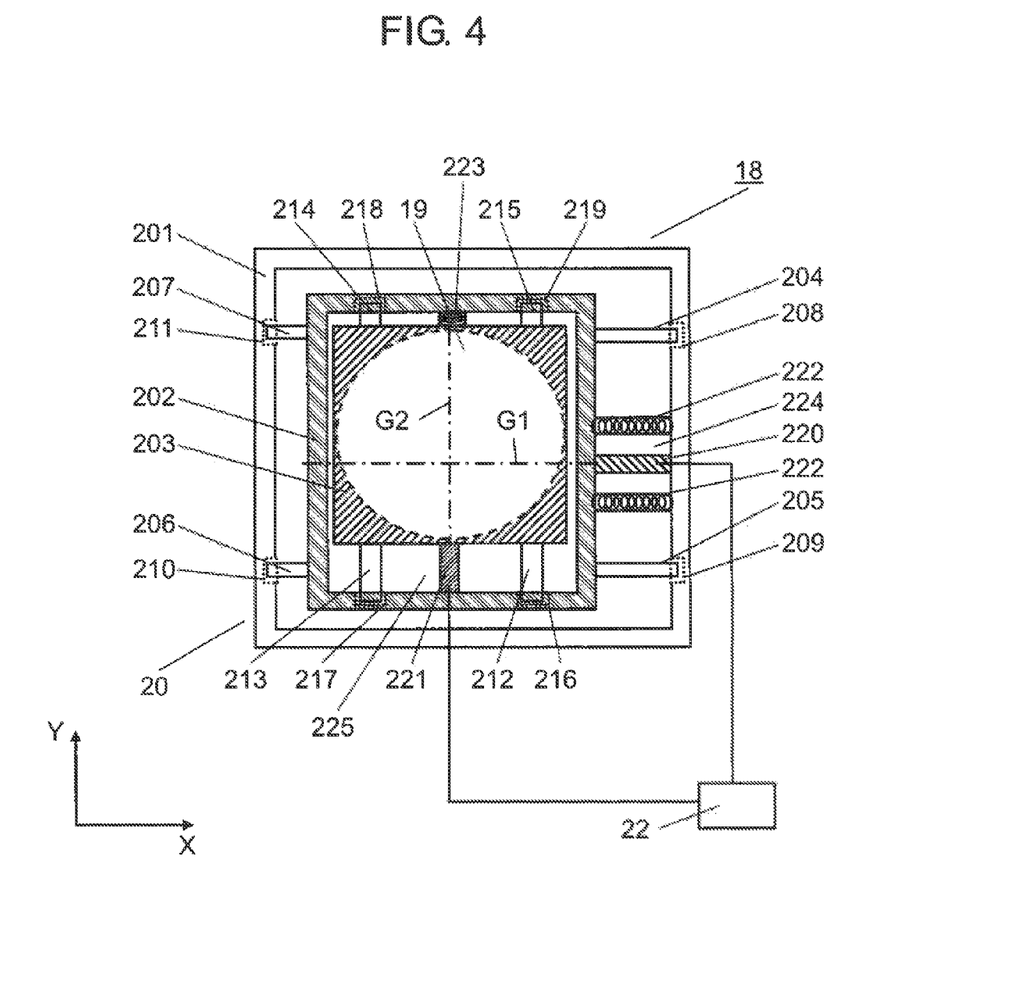
FIG. 4 is a pattern diagram for describing details of the optical system provided between the projecting optical system and the prism in the projector according to the embodiment.

FIG. 4 is a pattern diagram for describing one example of lens unit 18. As shown in FIG. 4, driving section 20 of lens unit 18 has lens outer frame 201, lens inner frame 202, and lens fixing member 203 made of a glass substrate.

Lens inner frame 202 is provided with pole brace 204, pole brace 205, pole brace 206, and pole brace 207. Further, lens outer frame 201 is provided with bearing hole 208, bearing hole 209, bearing hole 210, and bearing hole 211. Pole brace 204 is inserted into bearing hole 208, pole brace 205 is inserted into bearing hole 209, pole brace 206 is inserted into bearing hole 210, and pole brace 207 is inserted into bearing hole 211. Cross-sectional areas of the holes are larger than cross-sectional areas of the pole braces. Therefore, lens inner frame 202 is held so as to be movable with respect to lens outer frame 201.

Lens fixing member 203 is provided with pole brace 212, pole brace 213, pole brace 214, and pole brace 215. Lens inner frame 202 is provided with bearing hole 216, bearing hole 217, bearing hole 218, and bearing hole 219. Pole brace 212 is inserted into bearing hole 216, pole brace 213 is inserted into bearing hole 217, pole brace 214 is inserted into bearing hole 218, and pole brace 215 is inserted into bearing hole 219. Cross-sectional areas of the holes are larger than cross-sectional areas of the pole braces. Therefore, lens fixing member 203 is held so as to be movable with respect to lens inner frame 202.

Piezoelectric elements 220 and 221 are elements whose lengths fluctuate due to application of driving signals (voltages), and performs an extending operation by the application of driving signals whereas performs a shortening operation by stopping the application of driving signals. Piezoelectric element 220 is fixed to lens outer frame 201, and piezoelectric element 221 is fixed to lens inner frame 202. Piezoelectric element 220 touches lens inner frame 202, and piezoelectric element 221 touches lens fixing member 203. Piezoelectric elements 220 and 221 are connected to control circuit 22, and control circuit 22 supplies a driving signal to each of piezoelectric elements 220 and 221. When the driving signal is supplied from control circuit 22, piezoelectric elements 220 and 221 perform the extending operation.

Spring 222 is disposed on both sides of piezoelectric element 220 with a space between them, and both ends of Spring 222 are fixed to lens outer frame 201 and lens inner frame 202, respectively. Spring 222 applies a tensile force for making lens inner frame 202 and lens outer frame 201 attract each other against a force in a direction where piezoelectric element 220 extends. When piezoelectric element 220 extends to push lens inner frame 202, the lens inner frame 202 moves to a minus direction of an X axis with respect to lens outer frame 201. Further, when piezoelectric element 220 is shortened and spring 222 pulls lens inner frame 202, the lens inner frame 202 moves to a pulse direction of the X axis with respect to lens outer frame 201.

Spring 223 is disposed so as to face piezoelectric element 221 via lens 19, and its both ends of spring 223 are fixed to lens inner frame 202 and lens fixing member 203, respectively. Spring 223 applies a pressing force for pressing lens 19 together with lens fixing member 203 to piezoelectric element 221 against the force of the extending direction of piezoelectric element 221. When piezoelectric element 221 extends to push lens fixing member 203, lens 19 and lens fixing member 203 move together to a plus direction of a Y axis with respect to lens inner frame 202. When piezoelectric element 221 is shortened so that spring 223 pushes lens fixing member 203, lens 19 and lens fixing member 203 move together to a minus direction of the Y axis with respect to lens inner frame 202.

That is to say, piezoelectric element 220 and spring 222 compose first actuator section 224 for moving lens 19 to an X-axial direction, and piezoelectric element 221 and spring 223 compose second actuator section 225 for moving lens 19 to a Y-axial direction. First actuator section 224 is disposed so that thrust line G1 passes through a centroid of the lens section having lens 19, lens inner frame 202 as a lens holding section for holding lens 19, and lens fixing member 203. The lens section has piezoelectric element 221, spring 223, pole the pole braces 212, 213, 214 and 215, and pole braces 204, 205, 206 and 207 besides lens 19, lens inner frame 202, and lens fixing member 203.

Further, second actuator section 225 is disposed so that thrust line G2 passes through a centroid of a lens section having lens 19 and lens fixing member 203 as a lens holding section for holding lens 19. The lens section has pole braces 212, 213, 214 and 215 beside lens 19 and lens fixing member 203.

Next, movement of the lens is concretely described below. When first actuator section 224 transits from an initial state that a driving signal is not supplied to piezoelectric element 220 into a state that a driving signal is supplied and piezoelectric element 220 extends, lens 19, lens inner frame 202 and lens fixing member 203 move together to the minus direction of the X-axial direction with respect to lens outer frame 201. When first actuator section 224 transits from the state that piezoelectric element 220 extends into the initial state that the supply of a driving signal to piezoelectric element 220 is stopped, lens 19, lens inner frame 202 and lens fixing member 203 move together to the plus direction of the X axis with respect to lens outer frame 201 due to the force of spring 222.

When second actuator section 225 transits from the initial state that a driving signal is not supplied to piezoelectric element 221 into the state that a driving signal is supplied and piezoelectric element 221 extends, lens 19 and lens fixing member 203 move together to the plus direction of the Y-axial direction with respect to lens inner frame 202. When second actuator section 225 transits from the state that piezoelectric element 221 extends into the initial state that the supply of a driving signal to piezoelectric element 221 is stopped, lens 19 and lens fixing member 203 move together to the minus direction of the Y axis with respect to lens inner frame 202 due to the force of spring 223.

Lens unit 18 includes first actuator section 224 having piezoelectric element 220 for moving lens 19 to the X-axial direction, and second actuator section 225 having piezoelectric element 221 for moving lens 19 to the Y-axial direction. Control circuit 22 controls driving signals to be supplied to piezoelectric elements 220 and 221, so that lens 19 can be moved to at least two or more directions in a plane vertical to the optical axis of projecting optical system 17.

Furthermore, since the first and second actuator sections 224 and 225 are disposed so that thrust lines G1 and G2 pass through the centroid of the lens section composed of lens 19 and the lens holding section, the movement of lens 19 is stable, and lens 19 can move to at least two or more directions with high accuracy.

In the embodiment, first actuator section 224 is constituted so that spring 222 for applying a tensile force to the lens section is disposed on both sides of piezoelectric element 220, but may be constituted so that spring 222 for applying a tensile force to the lens section is disposed only on one side of piezoelectric element 220. Similarly to second actuator section 225, spring 222 for applying a pressing force to the lens section against the force of the direction where piezoelectric element 220 extends may be disposed on a position where it faces piezoelectric element 220 via lens 19. Further, second actuator section 225 may be constituted, similarly to first actuator section 224, so that spring 223 for applying a tensile force to the lens section against the force of the direction where piezoelectric element 221 extends is disposed on both the sides or one side of piezoelectric element 221. First and second actuator sections 224 and 225 are constituted by using the springs 222 and 223 in order to counter the force of the direction where piezoelectric elements 220 and 221 extend, but members such as piezoelectric elements other than springs 222 and 223 may be used as long as they counter the force of the direction where piezoelectric elements 220 and 221 extend.

Further, first and second actuator sections 224 and 225 are disposed so that thrust line G1 and G2 pass through the centroid of the lens section composed of lens 19 and the lens holding section, but since the centroid of lens 19 can be matched with centroids G1 and G2 of the lens section in a certain constitution of the lens holding section, it goes without saying that the centroids of the lens section include the centroid of the lens.

Figure 5A:
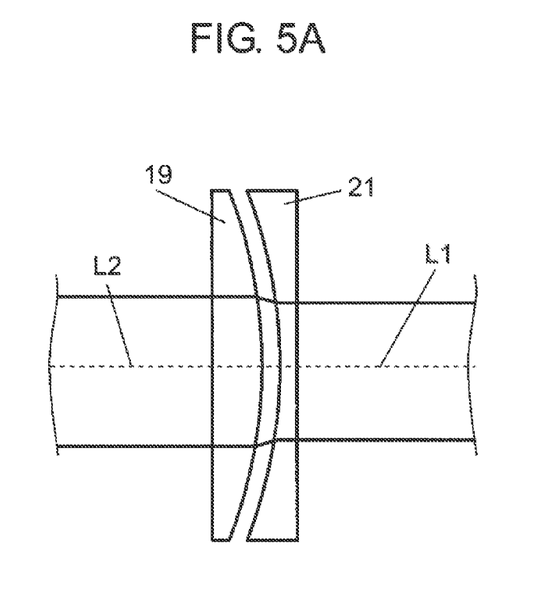
FIG. 5A is a pattern diagram for describing a principle of a change in a light advancing direction due to movement of a lens.
Figure 5B:
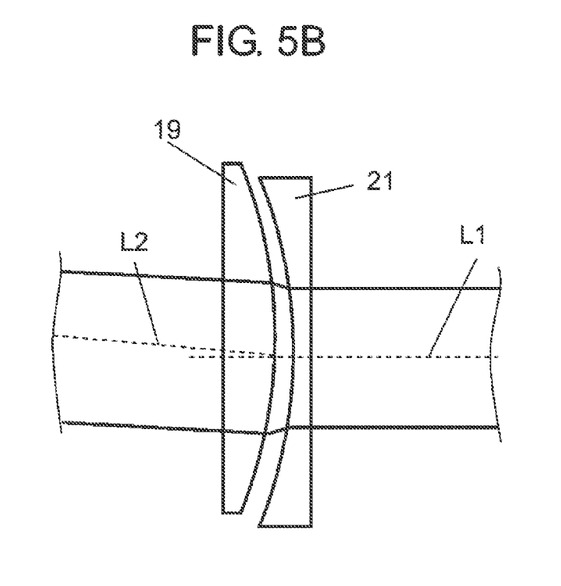
FIG. 5B is a pattern diagram for describing a principle of a change in a light advancing direction due to movement of the lens.

FIGS. 5A and 5B are pattern diagrams for describing a principle such that the advancing direction of light changes when the lens moves. As shown in FIGS. 5A and 5B, the light emitted from prism 122 of image display section 10 transmits through lens 21 and lens 19. The light that transmits through lens 21 and lens 19 is incident on projecting optical system 17.

As shown in FIG. 5A, lens 21 and lens 19 have a characteristic such that their lens effects cancel each other. In a state that lens 19 does not move, optical axis L1 of lens 21 matches with optical axis L2 of lens 19. In this case, lens 21 and lens 19 are combined so as to function similarly to one glass plate. That is to say, the light emitted from prism 122 is in approximately like a state such that the light transmits through the glass plate so as to be incident on projecting optical system 17.

When lens 19 moves, as shown in FIG. 5B, optical axis L2 of the light emitted from image display section 10 and passing through lens 19 tilts with respect to optical axis L1 of the light passing through lens 21, and thus an advancing direction of the light changes. Due to the above function, a position of pixels of an image displayed on the projection surface via projecting optical system 17 moves.

1-2. Description of the Operation

Figure 6:
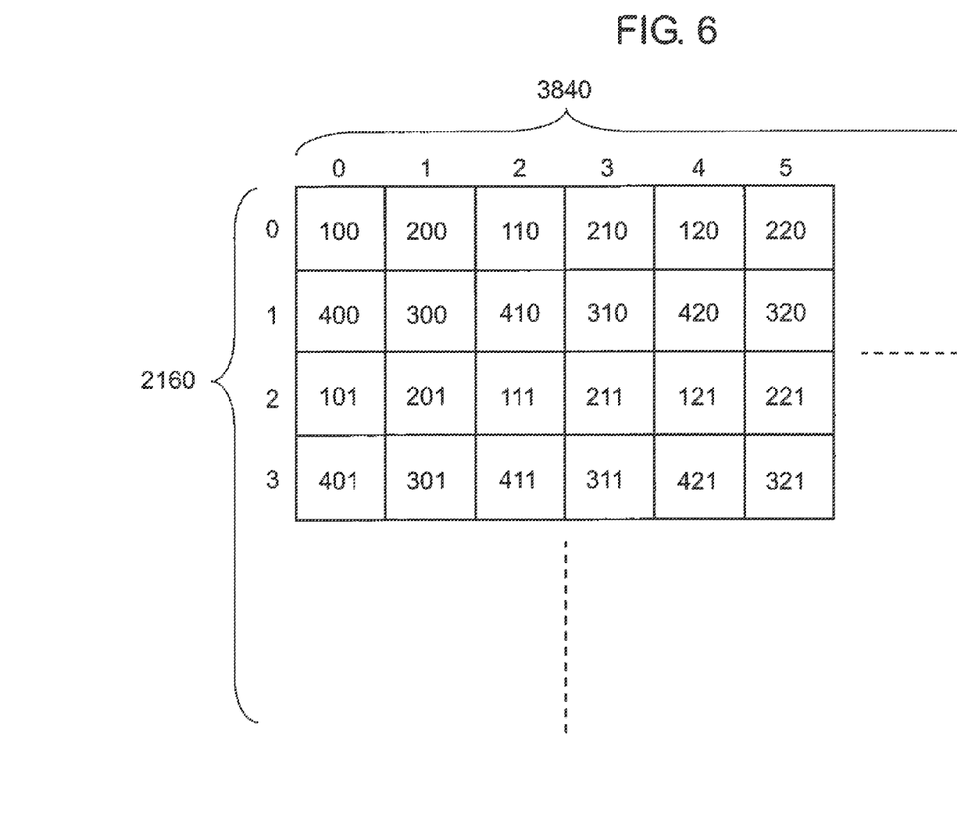
FIG. 6 is a pattern diagram illustrating an example of an image to be input into the projector according to the embodiment.
Figure 7:
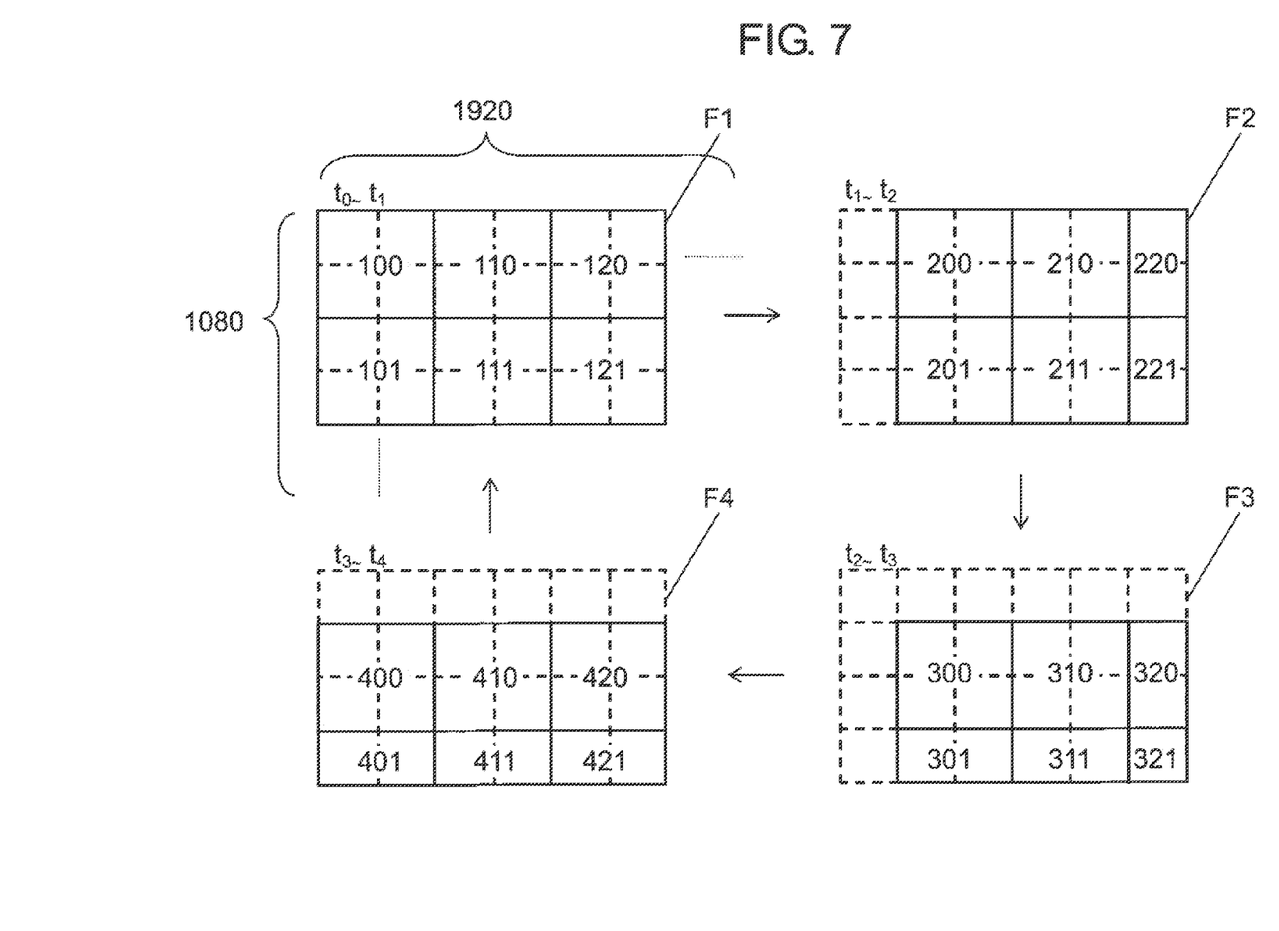
FIG. 7 is a pattern diagram for describing a procedure where the projector according to the embodiment outputs an image.

The operation of the projector is described below with reference to FIG. 6 and FIG. 7. FIG. 6 is a pattern diagram illustrating one example of an image signal to be input. FIG. 7 is a pattern diagram for describing a procedure in which the projector outputs an image.

Projector 1 can project an image of 1920 pixels in the horizontal direction×1080 pixels in the vertical direction onto a projection surface. An image signal shown in FIG. 6 is input into projector 1 from a personal computer or the like that is externally connected. The image signal shown in FIG. 6 is one example of a image having resolution of so-called 4K2K composed of 3840 pixels in the horizontal direction×2160 pixels in the vertical direction. That is to say, a number of the horizontal pixels and a number of vertical pixels of an image to be input are twice as large as a number of the horizontal pixels and a number of the vertical pixels of an image to be output. The total number of the pixels of the image to be input is four times as large that of the image to be output. Therefore, as shown in FIG. 7, in projector 1, 3840 pixels×2160 pixels are grouped into four sub-frames, and the four sub-frames are sequentially switched to be output so that an operation that provides the resolution of 4K2K to a user is performed.

A link such that each pixel of 4K2K belongs each of the four sub-frames is described first.

In FIG. 6 and FIG. 7, when a numerical value representing a number counted from 0 in the horizontal direction is divided by 2 and a reminder is 0, and a numerical value representing a number counted from 0 in the vertical number is divided by 2 and a reminder is 0, the pixels belong to a first sub-frame. When the numerical value representing a number counted from 0 in the horizontal direction is divided by 2 and the reminder is 1, and the numerical value representing a number counted from 0 in the vertical direction is divided by 2 and the reminder is 0, the pixels belong to a second sub-frame. When the numerical value representing a number counted from 0 in the horizontal direction is divided by 2 and the reminder is 1, and the numerical value representing a number counted from 0 in the vertical direction is divided by 2 and the reminder is 1, the pixels belong to a third sub-frame. When the numerical value representing a number counted from 0 in the horizontal direction is divided by 2 and the reminder is 0, and the numerical value representing a number counted from 0 in the vertical direction is divided by 2 and the reminder is 1, the pixels belong to a fourth sub-frame.

Meanings of the numbers allocated to the respective pixels are described below with reference to FIG. 6. A first-digit numerical value from the left in a triple-digit numerical value allocated to each of the pixels is a numerical value representing any sub-frame in the four sub-frames to which pixels are allocated. That is to say, any one of 1 to 4 is allocated as the first-digit numerical value from the left. A second-digit numerical value from the left in the triple-digit numerical value is a natural number (natural number of quotient) of a result of dividing a numerical value counted from "0" at the left end in the horizontal direction by "2" in FIG. 6. Further, a third-digit numerical value from the left in the triple-digit numerical value is a natural number (natural number of quotient) of a result of dividing a numerical value counted from "0" at the top end in the vertical direction by "2" in FIG. 6.

For example, a case of a third pixel counted from "0" in the horizontal direction (numerical value "2") and a third pixel counted from "0" in the vertical direction (numerical value "2") is considered. As to this pixel, a pixel number in the horizontal direction is "2", a pixel number in the vertical direction is "2", and a remainder as a result of division by "2" is "0". That is to say, this pixel belongs to the first sub-frame, and a first-digit numerical value from the left in the numerical values allocated to this pixel is "1." A natural number as a result of dividing the pixel number "2" in the horizontal direction by "2" is "1", and a second-digit numerical value from the left in the numerical values allocated to this pixel is "1". Further, a natural number as a result of dividing the pixel number "2" in the vertical direction by "2" is "1", and a third-digit numerical value in the numerical values allocated to this pixel is "1". That is to say, the triple-digit numerical value allocated to this pixel is "111".

A procedure for outputting an image in projector 1 is described with reference to FIG. 7.

As described above, the image signals in the first sub-frame to the fourth sub-frame are sequentially switched to be output. The first sub-frame is output at a t0 to t1 sub-frame period, and the second sub-frame is output at a next t1 to t2 sub-frame period. The third sub-frame is output at a next t2 to t3 sub-frame period, and the fourth sub-frame is output at a next t3 to t4 sub-frame period.

As shown in FIG. 7, image display section 10 of projector 1 displays a sub-frame image composed of a pixel group in the first sub-frame at the first sub-frame period. At this time, in driving section 20 of lens unit 18 in projector 1, since driving signals are not supplied to piezoelectric elements 220 and 221, lens 19 is on a position of the initial states of the X axis and the Y axis. Therefore, an image projected onto projection surface by the projecting optical system 17 is inverted vertically and horizontally by projecting optical system 17, and image F1 based on the sub-frame displayed on image display section 10 is directly projected.

Driving section 20 of lens unit 18 in projector 1 moves lens 19 to the minus direction of the X axis when a driving signal is supplied to piezoelectric element 220. On the other hand, since driving section 20 does not supply a driving signal to piezoelectric element 221, lens 19 is continuously on a position of the initial state on the Y axis. Thereafter, image display section 10 of projector 1 displays a sub-frame image composed of a pixel group in the second sub-frame at the second sub-frame period. Therefore, a image projected onto the projection surface by projecting optical system 17 is inverted horizontally and vertically by projecting optical system 17, and image F2, that is obtained when the position of pixels in the sub-frame image displayed on image display section 10 moves to the plus direction on the X axis by ½ pixel, is projected.

Since a driving signal is supplied to piezoelectric element 221 with the driving signal being supplied to piezoelectric element 220, driving section 20 of lens unit 18 in projector 1 moves lens 19 to the plus direction on the Y axis with the state of the movement to the minus direction on the X axis being maintained. Thereafter, image display section 10 of projector 1 displays a sub-frame image composed of a pixel group in the third sub-frame at the third sub-frame period. Therefore, a image projected onto the projection surface by projecting optical system 17 is inverted horizontally and vertically by projecting optical system 17, and image F3, that is obtained when the position of pixels in the sub-frame image displayed on image display section 10 moves to the minus direction on the Y axis by ½ pixel, is projected.

Driving section 20 of lens unit 18 in projector 1 stops the supply of the driving signal to piezoelectric element 220, and continues the supply of the driving signal to piezoelectric element 221, so as to move lens 19 to the plus direction on the X axis with the state of the movement to the plus direction on the Y axis being maintained. Thereafter, image display section 10 of projector 1 outputs a sub-frame image composed of a pixel group in the fourth sub-frame at the fourth sub-frame period. Therefore, a image projected onto the projection surface by projecting optical system 17 is inverted horizontally and vertically by projecting optical system 17, and image F4, that is obtained when the position of pixels in the sub-frame image displayed on image display section 10 moves to the minus direction on the X axis by ½ pixel, is projected.

Driving section 20 of lens unit 18 in projector 1 stops the supply of the driving signal to piezoelectric element 221, so that lens 19 returns to the position of the initial state on the X axis and the Y axis.

Thereafter, the similar control is made at next one frame so that an image is projected.

Projector 1 moves the positions of the pixels in the sub-frame images at the first sub-frame period to the fourth sub-frame period obtained by dividing one frame so that center positions of the pixels do not overlap with each other, and projects the sub-frame images onto the projection surface. As a result, a image, that is composed of 3840 pixels in the horizontal direction×2160 pixels in the vertical direction and has a high resolution of so-called 4K2K, can be projected.

An example of the image projecting device such as a projector include a interchangeable lens type product in which projecting optical system 17 can be interchanged. Such an interchangeable lens type product should cope with various interchangeable lenses. On the contrary, the interchangeable lens should cope with the image projecting device. For this reason, in the interchangeable lens type image projecting device, a gap between the projecting optical system and the prism of the image display section is predetermined. Further, each manufacturer sets the gap between the projecting optical system and the prism of the image display section as small as possible in order to make the entire device as small as possible.

In projector 1 of the present invention, a movable lens in the plurality of the lenses 19 and 21 disposed between projecting optical system 17 and prism 122 of image display section 10 is lens 19, and a space necessary for moving the lens can be set to be minimal. That is to say, since only lens 19 moves, the space may be provided only before and after lens 19, and the gap between lens 21 and prism 122 can be set to be minimal. For example, like the embodiment, lens 21 can be disposed so as to touch prism 122. Even when a thickness of lens 21 is thin such that its single body warps due to its dead-weight, the touch with prism 122 can maintain a shape flat.

2. Another Embodiment

As the example of the present invention, the above embodiment is described, but the present invention is not limited to this and can be suitably applied also to embodiments where changes, replacements, additions and omission are carried out.

Figure 8:
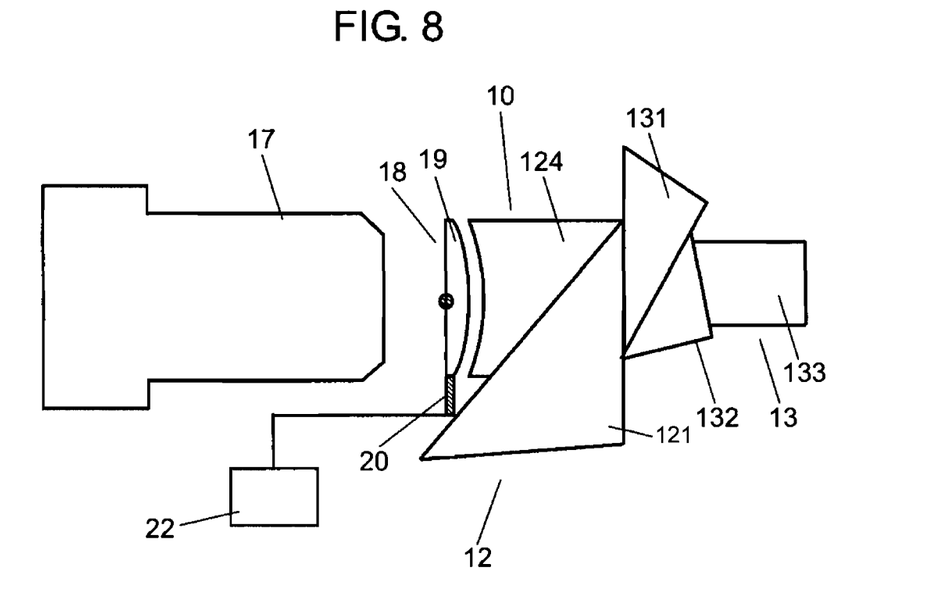
FIG. 8 is a pattern diagram for describing an outline of an optical system provided between the projecting optical system and the prism in the projector according to another embodiment.

In the above embodiment, lens 21 is disposed so as to touch prism 122, but is not necessarily limited to such a constitution. For example, as shown in FIG. 8, a prism 124 that is constituted by disposing a plano-concave lens on prism 122 by monolithic molding is used, and lens 21 may be omitted. In short, a portion having the similar function to that of lens 21 may be provided to prism 122.

Figure 9:
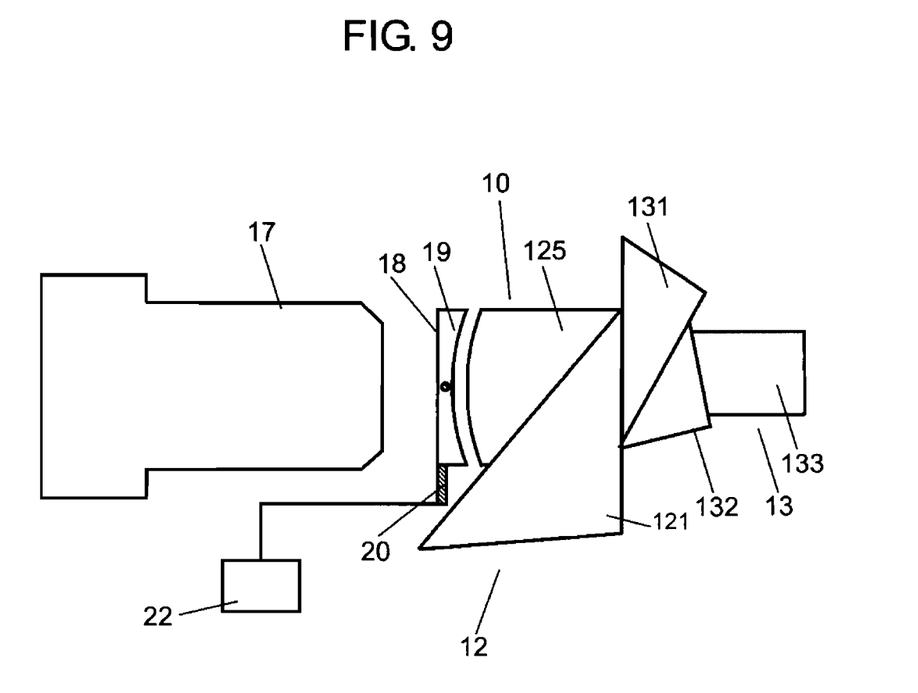
FIG. 9 is a pattern diagram for describing an outline of the optical system provided between the projecting optical system and the prism in the projector according to another embodiment.

As shown in FIG. 9, prism 125 constituted by disposing a plano-convex lens on prism 122 by monolithic molding is used, and lens 21 may be omitted. In this case, in lens unit 18, lens 19 that can move in the plane vertical to the optical axis of projecting optical system 17 has a concave lens on a side of prism 125 and a plano-concave lens having a flat surface on projecting optical system 17.

As shown in FIG. 8 and FIG. 9, when a plano-concave lens or a plano-convex lens are monolithically molded to prism 122 of image display section 10, and lens 21 is omitted, a concave section or a convex section is formed on the surface of the prism so that the lens can be formed. For this reason, the gap between image display section 10 and projecting optical system 17 can be shortened. In the case of the example shown in FIG. 8, the concave section is formed on the surface without changing the size of the prism, so that the lens can be formed. For this reason, in comparison with the case shown in FIG. 9, the thickness of the prism can be reduced by about 1 mm, and thus the gap between image display section 10 and projecting optical system 17 can be further shortened. On the other hand, like the embodiment shown in FIG. 9, when lens 21 on the side of prism 122 is a plano-convex lens and lens 19 of lens unit 18 is a plano-concave lens, a characteristic close to that of a glass plate is shown. For this reason, an influence that is exerted on a light harvesting performance of projecting optical system 17 is reduced.

Figure 10:
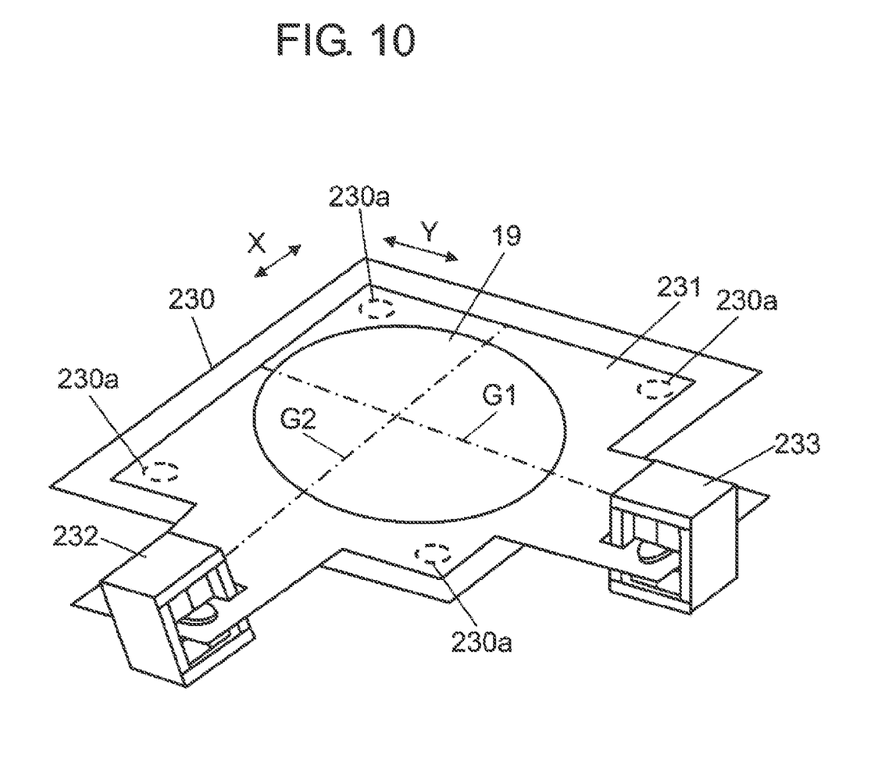
FIG. 10 is a pattern diagram for describing a lens unit of the projector according to another embodiment.

In the above embodiment, lens unit 18 is constituted so that the first and second actuator sections 224 and 225 using piezoelectric elements 220 and 221 move lens 19 in the plane vertical to the optical axis of projecting optical system 17, but as shown in FIG. 10, this can be realized also by an actuator using an electromagnet.

FIG. 10 is a pattern diagram for describing the lens unit of the projector according to another embodiment.

Driving section 20 according to the embodiment shown in FIG. 10 has lens frame 230, and lens moving frame 231 as the lens holding section that can move to the X-axial direction and the Y-axial direction with respect to lens frame 230 and holds lens 19. Actuator sections 232 and 233 made of electromagnets are disposed on ends of lens moving frame 231 in the X-axial direction and the Y-axial direction, and a driving signal is supplied to actuator sections 232 and 233 from control circuit 22, so that lens moving frame 231 moves to the X-axial direction and the Y-axial direction shown in FIG. 10. As a result, lens 19 can be moved to at least two or more directions in the plane vertical to the optical axis of projecting optical system 17. In FIG. 10, supporting section 230a disposed between lens frame 230 and lens moving frame 231 is for supporting lens moving frame 231 movable freely, and is made of an elastic member or a ball bearing.

Further, actuator sections 232 and 233 are disposed similarly to the above embodiment so that thrust lines G1 and G2 pass through the centroid of the lens section composed of lens 19 and lens moving frame 231 as the lens holding section.

Figure 11A:
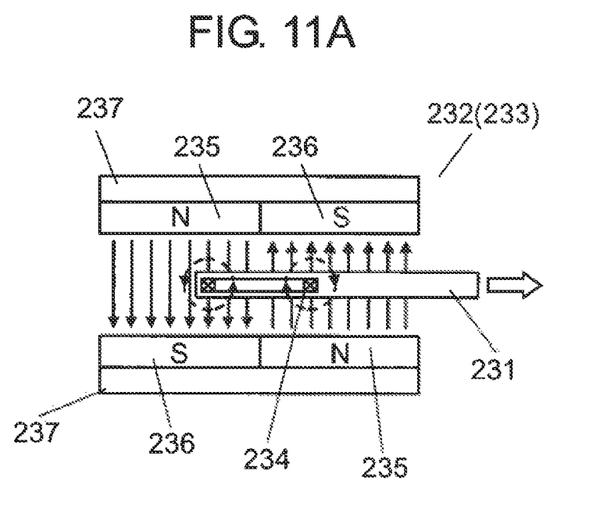
FIG. 11A is an explanatory diagram illustrating one example of an actuator section of the lens unit.
Figure 11B:
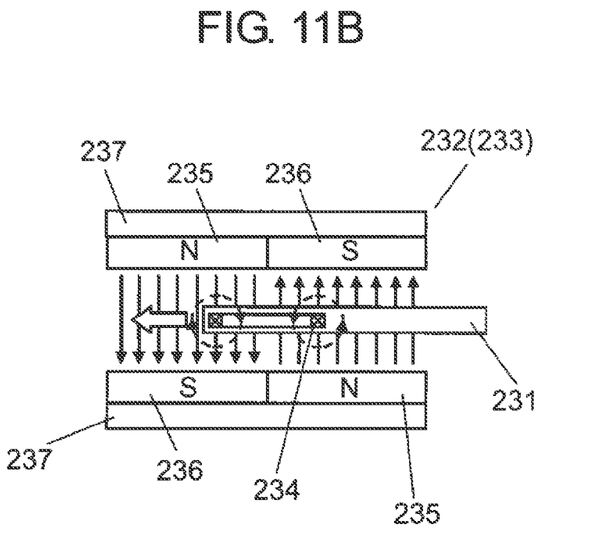
FIG. 11B is an explanatory diagram illustrating one example of the actuator section of the lens unit.

FIGS. 11A and 11B are explanatory diagrams illustrating an example of actuator section 232 (233). As shown in FIGS. 11A and 11B, actuator section 232 (233) has coil section 234 provided to lens moving frame 231, magnets 235 and 236 with N polarity and S polarity disposed so as to sandwich coil section 234, and yoke 237 for holding magnets 235 and 236.

Since coil section 234 is disposed in a magnet field formed by magnets 235 and 236, a direction of a current to be applied to coil section 234 is changed, and as indicated by dotted lines of FIGS. 11A and 11B, a direction of a magnetic field formed by coil section 234 is changed so that lens moving frame 231 moves to different directions as indicated by arrows.

Therefore, actuator sections 232 and 233 switch driving signals supplied from control circuit 22 to coil section 234, so that lens moving frame 231 can be moved to at least two or more directions in the plane vertical to the optical axis of projecting optical system 17. Further, with driving section 20 of the examples shown in FIGS. 10, 11A, and 11B, lens unit 18 can be composed of only lens moving frame 231 that moves to the X-axial direction and the Y-axial direction, it can be further reduced in size and weight. Actuator sections 232 and 233 are constituted so that coil section 234 is disposed on lens moving frame 231, and thus a weight of lens moving frame 231 can be reduced. When actuator sections 232 and 233 are driven to move lens moving frame 231, high responsiveness can be displayed. In the example shown in FIG. 11A and FIG. 11B, coil section 234 is provided to lens moving frame 231, and magnets 235 and 236 are provided to yoke 237, but on the contrary to the example in FIGS. 11A and 11B, coil section 234 may be provided to yoke 237, and magnets 235 and 236 may be provided to lens moving frame 231.

Besides the examples shown in FIGS. 10, 11A and 11B, driving section 20 may be constituted by using a piston mechanism or a cam mechanism. In short, any constitution may be adopted as long as it can move the lens.

As an example of the present invention, any embodiment other than the above-described embodiment can be adopted. Concretely, in the above embodiment, lens 19 is provided between projecting optical system 17 and prism 122, but the present invention is not limited to such an example. For example, lens 19 may be provided inside projecting optical system 17. In short, lens 19 may be on any position on an optical path of the light emitted from image display section 10.

In the above embodiment, the light source is composed of luminous tube 4 and reflector 5. However, the light source is not limited to such an example. For example, an LED or a laser may be used as the light source. In short, light may be emitted.

The above embodiment describes the example where the image of 1920 pixels in the horizontal direction×1080 pixels in the vertical direction can be projected, but the present invention is not limited to this example. For example, the number of pixels may be 3840 pixels in the horizontal direction×2160 pixels in the vertical direction.

In the above embodiment, the position of the pixels is moved sequentially by ½ pixel in the horizontal direction and the vertical direction at the first sub-frame period to the fourth sub-frame period, but the present invention is not limited to such an example. For example, the position of the pixels may be moved by ¼ pixel or ⅛ pixel. In short, the pixel centers are preferably not overlapped with each other at each sub-frame period. Further, the example that the projection position is moved in a clockwise fashion on the projection surface is described, but the present invention is not limited to such a constitution. For example, the projection position on the projection surface of each pixel may be moved in a counterclockwise fashion, or may be moved in order of the first sub-frame, the third sub-frame, the second sub-frame, and the fourth sub-frame. In short, the projection position on the projection surface of each pixel may be moved at each sub-frame period.

Further, in the above embodiment, the flat surface of lens 21 touches the prism. However, the present invention is not limited to such an example. For example, the flat surface of lens 21 may be bonded to prism 122 by an adhesive. At this time, refractive indexes of prism 122, the adhesive, and lens 21 are made to be equivalent to each other, so that reflection on a boundary surface can be prevented, and a decrease in a light quantity can be prevented. As a result, flatness of lens 21 is maintained at higher accuracy.

In the above embodiment, DMD is used as the image display section. However, the present invention is not limited to such an example. Another image display section such as a transmission type liquid crystal panel or a reflection type liquid crystal panel may be used.

The above embodiment illustrates the example of the combination of the plano-convex lens and the plano-concave lens, but the constitution may be such that the lens effects totally cancel each other.

Further, the example where lens 19 is fixed to lens fixing member 203 is illustrated, but lens fixing member 203 may be a glass substrate, and lens 19 may be formed on the glass substrate being as lens fixing member 203. The glass substrate as lens fixing member 203 may be a part of the lens.

The example where spring 222 is used so that lens inner frame 202 and lens outer frame 201 are attracted each other is described, but any means may be used as long as a force is applied so that lens inner frame 202 and lens outer frame 201 approach each other, and thus, for example, a magnet may be fixed to lens inner frame 202 and lens outer frame 201 so as that they attract each other. One of them is a magnet, and the other one is made of a material such as iron that is attracted to the magnet.

The example where spring 223 is used so that lens fixing member 203 and lens inner frame 202 attract each other is described, but any means may be used as long as a force is applied so that lens fixing member 203 and lens inner frame 202 approach each other, and thus, for example, a magnet may be fixed to lens fixing member 203 and lens inner frame 202 so that they attract each other. One of them is a magnet, and the other one is made of a material such as iron that is attracted to the magnet.

The constitution composed of DMDs 14, 15, and 16 is one example of the image display section. Projecting optical system 17 is one example of a projecting optical system. Lens 19 is one example of a lens. The constitution composed of piezoelectric elements 220 and 221, springs 222 and 223 and control circuit 22 is one example of driving section 20. DMDs 14, and 16 are one example of an image display device. The constitution composed of prism 121 and prism 122 is one example of the image synthesizing section.

Projector 1 according to the embodiment includes image display section 10 composed of DMD for displaying an image, projecting optical system 17, lens 19, and lens unit 18 composed of driving section 20 for moving lens 19 and control circuit 22. Projecting optical system 17 outputs a displayed image along a predetermined optical path, and projects it onto a predetermined projection surface. Lens unit 18 is provided on any position of the predetermined optical path behind prism 122 of image display section 10, and lens 19 is movable to at least two or more directions in the plane vertical to the optical axis of projecting optical system 17. Driving section 20 is driving means for moving lens 19. When driving section 20 moves lens 19, it moves the display position of the pixels composing a image displayed by image display section 10 on the projection surface such that the pixel centers do not overlap with each other.

As a result, projector 1 can project an image with a high resolution in a simple constitution. Further, the gap between projecting optical system 17 and image display section 10 can be shortened.

The accompanying drawings and the detailed description provide the embodiment that is considered as a best mode and another embodiment. They are provided in order to exemplify a main subject of claims for those skilled in the art by referring to the specified embodiment. Therefore, various changes, replacements, additions and omissions can be carried out on the above embodiment within the scope and the equivalent scope of claims.

What is claimed is:

1. An image projecting device, comprising:
an image display section for displaying an image;
a projecting optical system for outputting the image displayed by the image display section along an optical path and projecting the image onto a projection surface; and a lens unit provided at a position that is on the optical path between the image display section and the projecting optical system, and is behind a prism of the image display section, wherein the lens unit includes a lens section having a lens movable along at least two or more directions in a plane vertical to an optical axis of the projecting optical system, and a driving section having an actuator section for moving the lens section, the actuator section disposed so that a thrust line passes through a centroid of the lens section, and the driving section moves the lens so as to tilt an optical axis of light emitted from the image display section, and moves a display position of pixels on the projection surface, the pixels composing the image displayed by the image display section.

2. The image projecting device according to claim 1, wherein the lens of the lens unit is a plano-convex lens, and a plano-concave lens fixed to the image display section is provided between the lens unit and the image display section, wherein a convex surface side of the plano-convex lens faces a concave surface side of the plano-concave lens.

3. The image projecting device according to claim 1, wherein the lens of the lens unit is a plano-concave lens, and a plano-convex lens fixed to the image display section is provided between the lens unit and the image display section, wherein a concave surface side of the plano-concave lens faces a convex surface side of the plano-convex lens.

4. An image projecting device, comprising:

an image display section for displaying an image;

a projecting optical system for outputting the image displayed by the image display section along an optical path and projecting the image onto a projection surface; and a lens unit provided at a position that is on the optical path between the image display section and the projecting optical system, and is behind a prism of the image display section, wherein the lens unit includes one lens movable along at least two or more directions in a plane vertical to an optical axis of the projecting optical system, and a driving section for moving the lens, and the driving section moves the lens so as to tilt an optical axis of light emitted from the image display section, and moves a display position of pixels on the projection surface, the pixels composing the image displayed by the image display section.

5. The image projecting device according to claim 4, wherein the lens of the lens unit is a plano-convex lens, and a plano-concave lens fixed to the image display section is provided between the lens unit and the image display section, wherein a convex surface side of the plano-convex lens faces a concave surface side of the plano-concave lens.

6. The image projecting device according to claim 4, wherein the lens of the lens unit is a plano-concave lens, and a plano-convex lens fixed to the image display section is provided between the lens unit and the image display section, wherein a concave surface side of the plano-concave lens faces a convex surface side of the plano-convex lens.

7. An image projecting device, comprising:

an image display section for displaying an image;

a projecting optical system for outputting the image displayed by the image display section along an optical path and projecting the image onto a projection surface; and a lens unit provided at a position that is on the optical path between the image display section and the projecting optical system, and is behind a prism of the image display section, wherein the lens unit includes a lens section having a lens and a lens holding section holding the lens, the lens movable along a first direction and a second direction vertical to the first direction in a plane vertical to an optical axis of the projecting optical system; and a driving section having a first actuator section for moving the lens section along the first direction, and a second actuator section for moving the lens section along the second direction, the lens unit is disposed so that a thrust line of each of the first and the second actuator sections passes through a centroid of the lens section having the lens and the lens holding section, the driving section moves the lens so as to tilt an optical axis of light emitted from the image display section, and moves a display position of pixels on the projection surface, the pixels composing the image displayed by the image display section.

* * * * *